United States Patent
Blish, II et al.

(10) Patent No.: US 6,841,841 B1
(45) Date of Patent: Jan. 11, 2005

(54) NEUTRON DETECTING DEVICE

(75) Inventors: Richard C. Blish, II, Saratoga, CA (US); Robert E. Likins, Saratoga, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/728,510

(22) Filed: Dec. 5, 2003

(51) Int. Cl.$^7$ ............................................. H01L 31/115
(52) U.S. Cl. ....................................... 257/429; 257/252
(58) Field of Search ................................. 257/429, 252

(56) References Cited

U.S. PATENT DOCUMENTS

| | | | |
|---|---|---|---|
| 5,319,210 A | * | 6/1994 | Moscovitch ............. 250/474.1 |
| 6,075,261 A | | 6/2000 | Hossain et al. ............. 257/252 |
| 6,765,978 B1 | * | 7/2004 | Kronenberg et al. ........ 376/147 |

* cited by examiner

Primary Examiner—David Nelms
Assistant Examiner—Tu-Tu Ho

(57) ABSTRACT

The present neutron sensing device includes a first substantially planar array of flash memory cells, a second substantially planar array of flash memory cells having an edge adjacent an edge of the first substantially planar array of flash memory cells, and a third substantially planar array of flash memory cells having a first edge adjacent an edge adjacent an edge of the first substantially planar array of flash memory cells and a second edge adjacent an edge of the second substantially planar array of flash memory cells. The plane of the second substantially planar array of flash memory cells is at an angle relative to the plane of the first substantially planar array of flash memory cells, and the plane of the third substantially planar array of flash memory cells is at an angle relative to the plane of the first substantially planar array of flash memory cells, and is at an angle relative to the plane of the second substantially planar array of flash memory cells, in the preferred embodiment of all such angles being indicated as 90°.

15 Claims, 6 Drawing Sheets

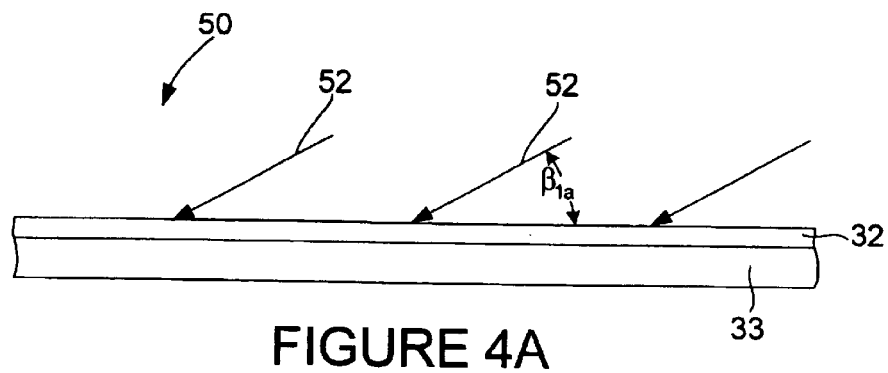
FIGURE 4A
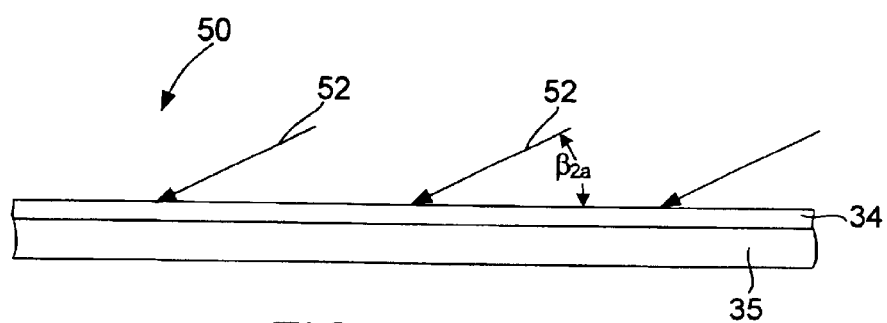
FIGURE 4B
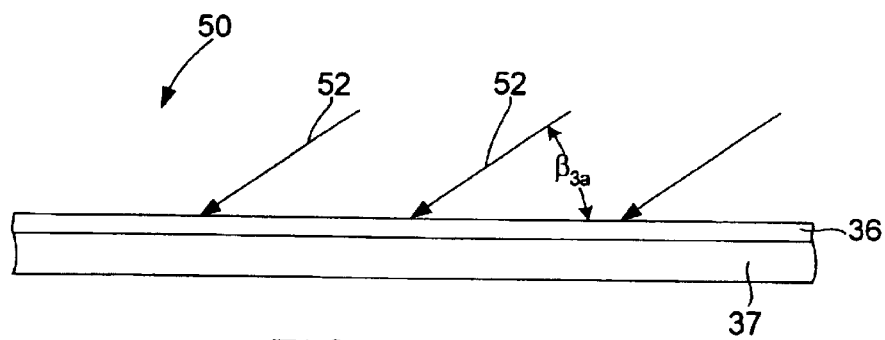
FIGURE 4C
FIGURE 4

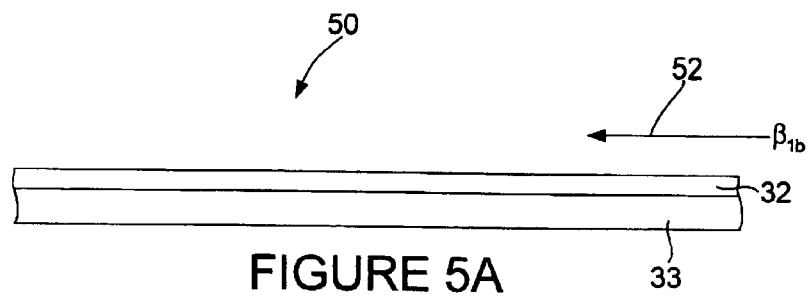
FIGURE 5A
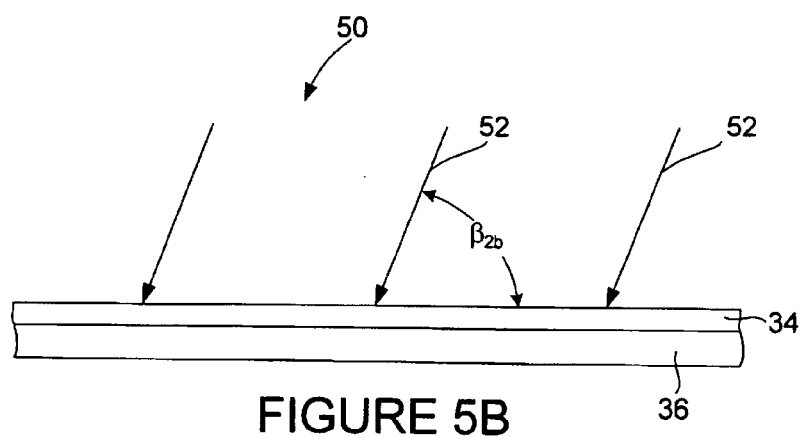
FIGURE 5B
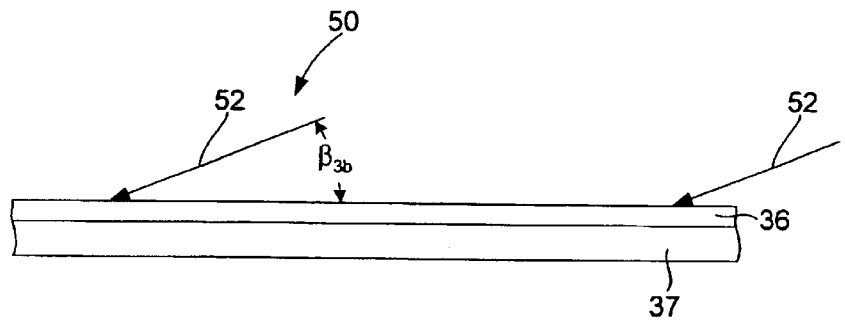
FIGURE 5C
FIGURE 5

NEUTRON DETECTING DEVICE

BACKGROUND OF THE INVENTION

1. Technical Field

This invention relates generally to semiconductor devices, and more particularly, to a neutron detecting device.

2. Background Art

U.S. Pat. No. 6,075,261 entitled NEUTRON DETECTING SEMICONDUCTOR DEVICE, invented by Hossain et al., assigned to the Assignee of this invention, discloses a neutron detecting device which is formed by providing an array of flash memory cells, with neutron-reactant material over the memory cells. Upon been penetrated by a neutron, the neutron-reacting material emits one or more particles capable of inducing a state change in a memory cell. For example, as disclosed in that patent, the state of the flash memory transistor illustrated and described therein is an on-state or a logical 1 state, associated with a negative charge on the floating gate and an inversion layer beneath the floating gate. In such case, the neutron-reactant material, upon being penetrated by a neutron, emits one or more particles which pass through the inversion layer, sufficiently reducing the charge in the channel region of the transistor to remove the inversion layer and change the state of the memory cell to an off-state or logical 0 state.

The neutron detecting device includes a memory arrangement which includes a plurality of flash memory cells in the form of an array, as described above. Typically, the initial, undisturbed state of each memory cell is set to a logical 1. During a detection cycle, the state of each cell is read to determine whether such state has changed, indicating detection of neutrons in accordance with the above mechanism. The proportion of cells which have changed state compared to the overall number of cells in the array can be used to determine the presence and intensity of a neutron field. In a typical embodiment, the percentage of state changes can range from for example 0.001% to 0.1% of the total number of memory cells in the array. After a chosen time interval during which the reading of the cells takes place as described above, all of the memory cells are reset to logical 1 in preparation for the next detection cycle.

In such a device, a reading of intensity of the neutron field as indicated by the device is dependent on the orientation of the device relative to the path of travel of the neutrons of the neutron field, as will now be described and illustrated with regard to FIGS. 1 and 2.

FIG. 1 illustrates a neutron field 20 which includes a plurality of neutrons 22 flowing in the direction indicated. It will be understood that the neutrons 22 illustrated are a portion of a large neutron field 20, which field 20 extends sidewardly of FIG. 1 and also perpendicular to the plane of FIG. 1. The neutrons 22 are indicated as generally equally spaced apart a distance A for purposes of simplicity in this example. FIG. 2 illustrates portions of the subject matter of FIG. 1 enlarged for clarity.

With the memory cell array 24 (mounted on a substrate 26) oriented as shown in FIGS. 1A, 2A, the plane of the array 24 is substantially perpendicular to the direction of the flow of neutrons 22 ($\theta$ indicates the angle between the plane of the array 24 and the direction of flow of neutrons 22, in this case $\theta_1 = 90°$). In this situation, the spacing of the neutrons 22 impinging on the array 24 is substantially the same as the spacing A. A reading of intensity I of the neutron field 20 taken in accordance with the above procedure will indicate an intensity of, for example, I1. If the memory cell array 24 is oriented in the same neutron field 20 as shown at FIG. 1B, 2B (array 24 rotated counterclockwise relative to FIGS. 1A, 2A), with the plane of the array 24 not substantially perpendicular to the direction of flow of neutrons 22 but at an angle $\theta_2$ relative thereto, the spacing B of the neutrons 22 impinging on the array 24 is greater than the spacing A in the previous example. With this being the case, over a given period of time, the array 24 will be exposed to a smaller number of neutrons 22 than in the example of FIGS. 1A, 2A, decreasing the percentage of state changes in the array 24 as compared to the example of FIGS. 1A, 2A. Indeed, it will be seen that, with reference to FIG. 2B, the reading of intensity with the memory cell array 24 oriented as shown at FIGS. 1B, 2B is $$I = k \sin \theta$$

where k is a constant, and $\theta$ is the angle between the direction of flow of neutrons 22 and the plane of the array 24.

Likewise, if the memory cell array 24 is oriented as shown at FIGS. 1C, 2C (array 24 rotated clockwise relative to FIGS. 1A, 2A), with the plane of the array 24 not substantially perpendicular to the direction of flow neutrons 22 but at an angle $\theta_3$ relative thereto, the spacing C of the neutrons 22 impinging on the array 24 is greater than the spacing A in the example of FIG. 1A, 2A. Which this being the case, over a given period of time, the array 24 will be exposed to a lower number of neutrons 22 than in the example of FIGS. 1A, 2A, decreasing the percentage of state changes in the array 24 as compared to the example of FIGS. 1A, 2A.

Indeed, the above cited formula indicates a maximum intensity reading at $\theta = 90°$ (sin $\theta = 1$, FIG. 1A, 2A), which will readily be seen to be the case in reviewing FIGS. 1 and 2 in their entirety.

Thus, it will be seen that the level of intensity of the neutron field 20 indicated by the present device is dependent on the orientation of the device relative to the direction of flow of the neutrons 22.

In addition, while a level of intensity is read with the army 24 in a variety of positions relative to the direction of flow of neutrons 22, no indication is given as to the direction of neutron flow, i.e., the direction of the source of neutrons relative to the array 24.

Therefore, what is needed is a neutron detecting device which is capable of properly measuring the intensity of a neutron field and indicating the direction of the source of neutrons.

DISCLOSURE OF THE INVENTION

The present invention is an apparatus for sensing neutron flow. The apparatus includes a first substantially planar array of flash memory cells, a second substantially planar array of flash memory cells having an edge adjacent an edge of the first substantially planar array of flash memory cells, and a third substantially planar array of flash memory cells having a first edge adjacent an edge adjacent an edge of the fist substantially planar array of flash memory cells and a second edge adjacent an edge of the second substantially planar array of flash memory cells. The plane of the second substantially planar array of flash memory cells is at an angle relative to the plane of the first substantially planar array of flash memory cells, and the plane of the third substantially planar array of flash memory cells is at an angle relative to the plane of the first substantially planar array of flash memory cells and is at an angle relative to the plane of the second substantially planar array of flash memory cells.

The present invention is better understood upon consideration of the detailed description below, in conjunction with the accompanying drawings. As will become readily apparent to those skilled in the art from the following description, there is shown and described embodiment of this invention simply by way of the illustration of the best mode to carry out the invention As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

FIG. 4 is a view illustrating the orientations of several memory cell arrays of the present device relative to the path of neutrons of a neutron field;

FIG. 5 is a view illustrating the orientations of several memory cell arrays of the present device relative to the path of neutrons of a neutron field, with the device in an orientation different from that shown in FIG. 4.

BEST MODE(S) FOR CARRYING OUT THE INVENTION

Reference is now made in detail to a specific embodiment of the present invention which illustrates the best mode presently contemplated by the inventors for practicing the invention.

Figure 1:
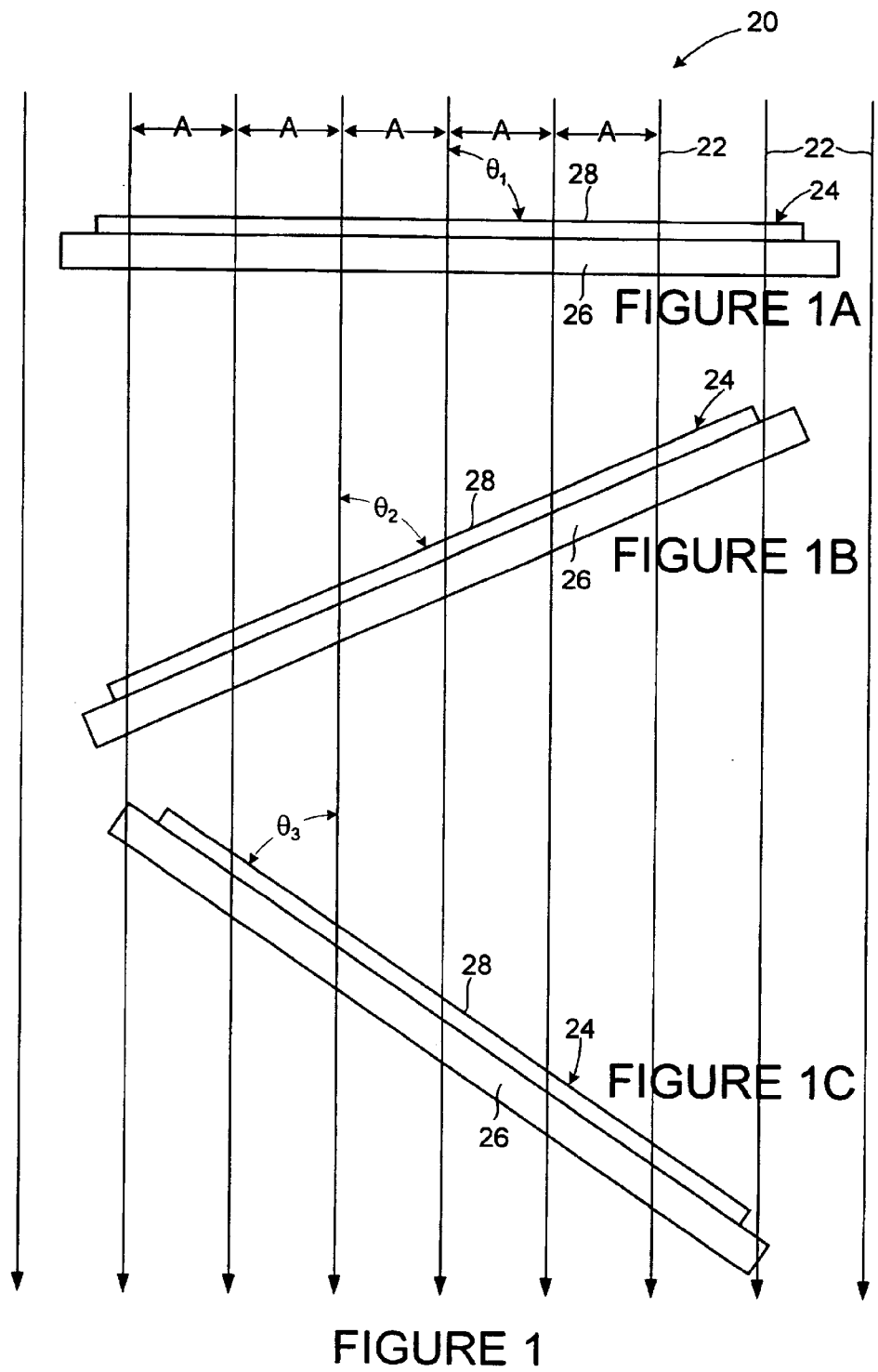
FIG. 1 is a view illustrating various orientations of a memory cell array relative to the path of the neutrons of a neutron field.
Figure 2:
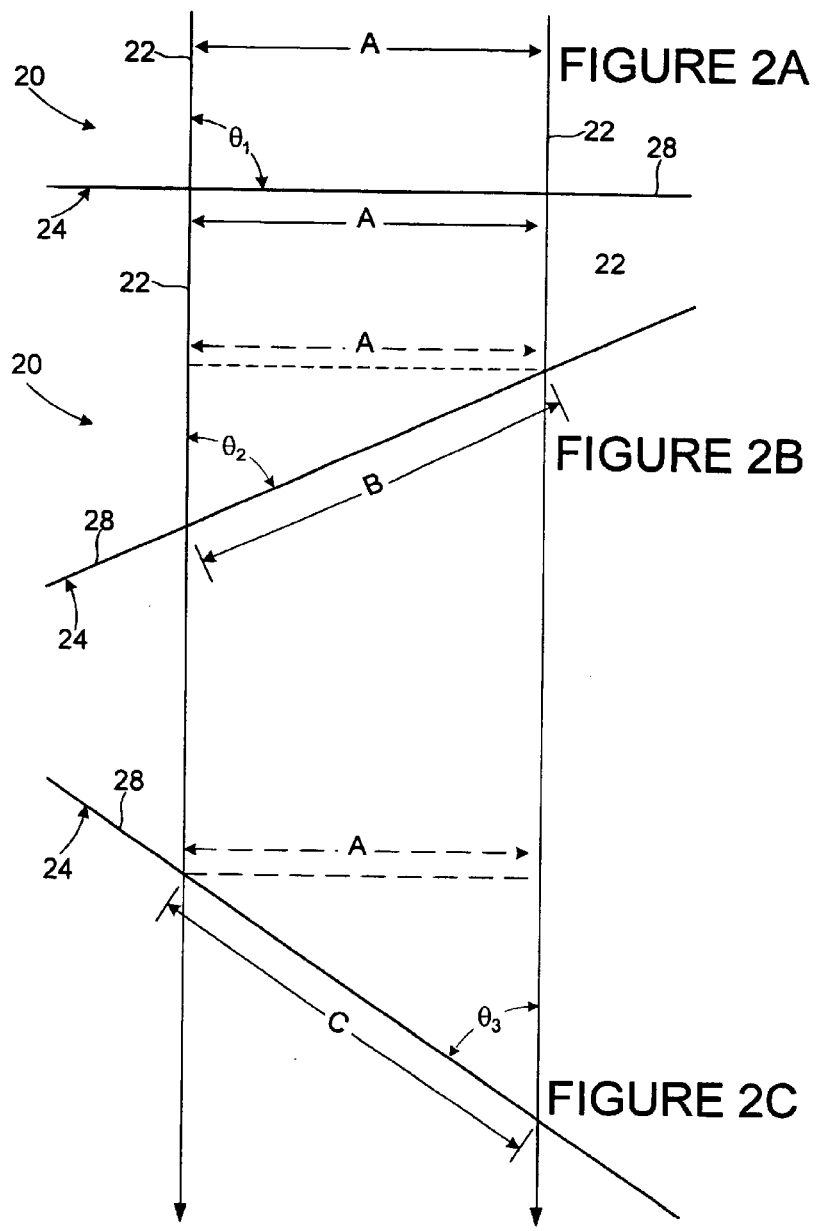
FIG. 2 is a view of enlarged portions of FIG. 1.
Figure 3:
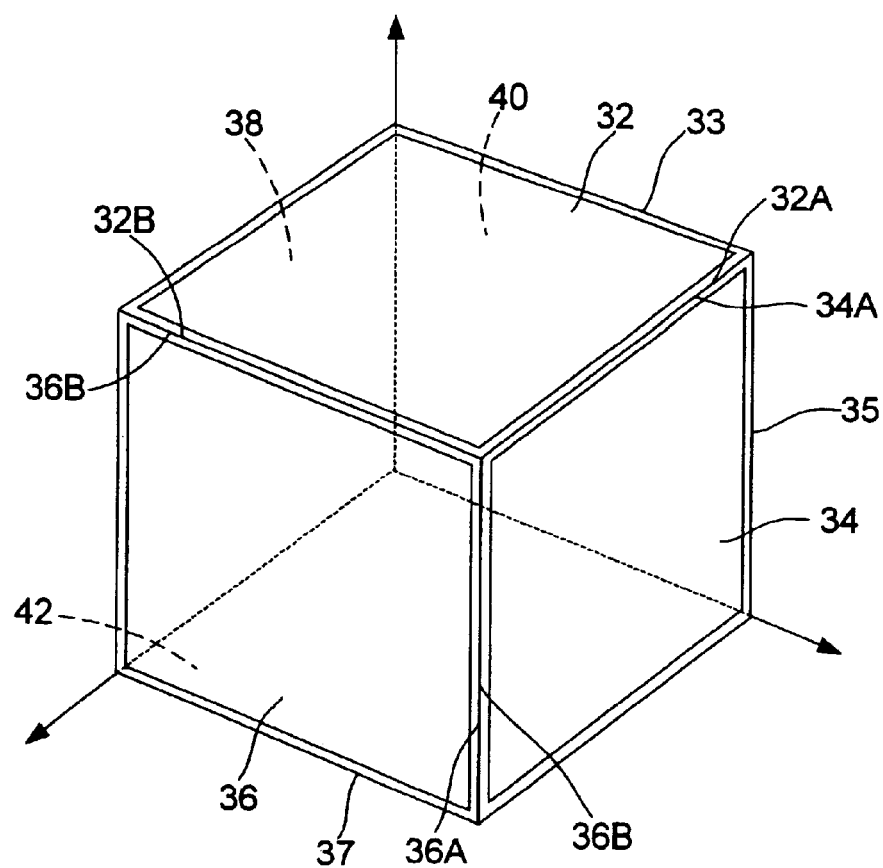
FIG. 3 is a perspective view illustrating an embodiment of the present invention.

FIG. 3 illustrates an embodiment of the present invention. As shown therein, the neutron detecting device 30 is in the form of a cube and includes first second, third, fourth, fifth and sixth substantially planar arrays 32, 34, 36, 38, 40, 42 of flash memory cells at the faces of the cube. The arrays 32, 34, 36 are mounted on respective neutron-absorbing substrates 33, 35, 37, and the arrays 38, 40, 42 are also mounted on respective neutron-absorbing substrates (not shown in FIG. 3 for clarity), with the arrays 32, 34, 36, 38, 40, 42 being fixed in position relative to each other. Each of the arrays 32, 34, 36, 38, 40, 42 is substantially rectangular in configuration, i.e., in this particular embodiment, substantially square in configuration, and the arrays 32,34, 36, 38, 40, 42 are in this embodiment substantially equal in array. The arrays 32–42 are arranged so that each edge of each array lies along an edge of another array, with the angle between the planes of such arrays being 90°. For example, the array 32 has an edge 32A adjacent and lying along an edge 34A of the array 34, the angle between the plane of the array 32 and the plane of the array 34 being 90°. The array 36 has an edge 36A adjacent and lying along an edge 34B of the array 34, and an edge 36B adjacent and lying along an edge 32B of the array 32, the angle between the plane of the array 36 and the plane of the array 34 being 90°, the angle between the plane of the array 36 and the plane of the array 32 being 90°.

With reference to both FIG. 3 and 4, assuming presence of a neutron field 50 wherein the direction of travel of the neutrons 52 is directly toward the device 30 from the position of the observer of FIG. 3, i.e., substantially perpendicular to and into the plane of the drawing of FIG. 3, neutrons 52 will strike the array 32 at angle $\beta_{1a}$ relative to the plane of the array 32, at angle $\beta_{2a}$ relative to the plane to the array 34, and at angle $\beta_{3a}$ relative to the plane to the array 36 (FIG. 4). With the device 30 so positioned relative to the direction of travel of the neutrons 52, a reading of level of intensity is taken at each of the arrays 32, 34, 36, resulting in intensity readings $I_{1a}$ for array 32, 12, for array 34, and $I_{3a}$ for array 36. Intensity level indicated at each of the arrays 38, 40, 42 will be zero because of the neutron-absorbing substrates associated with each of the arrays 32–42, which will absorb neutrons passing through an array from reaching another array of the device 30.

Next, the device 30 is rotated in a manner so that only two of the arrays indicate an intensity level, that is, all of the other arrays indicate zero intensity level. For example, with reference to FIGS. 5 and 6, the device 30 is rotated until the intensity level indicated that the array 32 is zero (the intensity level indicated at each of the arrays 38, 40, 42, also being zero because of the neutron absorbing substrates), leaving only arrays 34, 36 indicating an intensity level (it will be understood that one is careful not to rotate and position the device 30 so that an array other than arrays 34, 36, for example array 42, indicates an intensity level, the point being to arrive at a device position where only two of the arrays, in this example arrays 34, 36, provide a reading of intensity level while all the other arrays, in this example arrays 32, 38, 40, 42, indicate an intensity level of zero. This situation is illustrated in FIG. 5, wherein neutrons 52 will not strike the array 32 ($\beta_1$=0, sin $B_{1b}$=0), FIG. 5A, will strike the array 34 at an angle $\beta_{2b}$ relative to the plane of the array 34, FIG. 5B, and will strike the array 36 at an angle $\beta_{3b}$ relative to the plane of the array 36, FIG. 5C. See also FIG. 6.

It will be seen that the ratios of the intensities indicated by the arrays 34, 36, i.e., $I_{2b}:I_{3b}$, is readily determined. That is, in accordance with the above discussion, since $$I = k \sin \beta,$$

for each of the arrays 34, 36, $$I_{2b} = k \sin \beta_{2b} \text{ for array 34}$$

$$I_{3b} = k \sin \beta_{3b} \text{ for array 36}$$

and the ratio of the sines of $\beta_{2b}$, $\beta_{3b}$ $$\sin \beta_{2b} : \sin \beta_{3b}$$

can be readily determined this ratio being the sane as the ratio $$I_{2b}:I_{3b}$$

Figure 6:
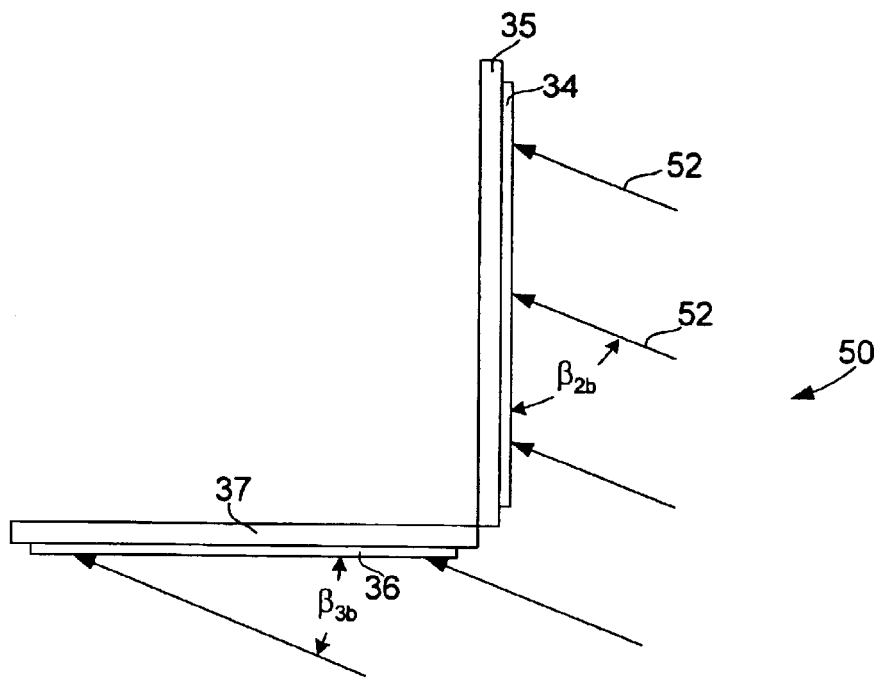
FIG. 6 is a view illustrating an orientation of a pair of arrays of the device relative to the path of neutrons of a neutron field.
Figure 7:
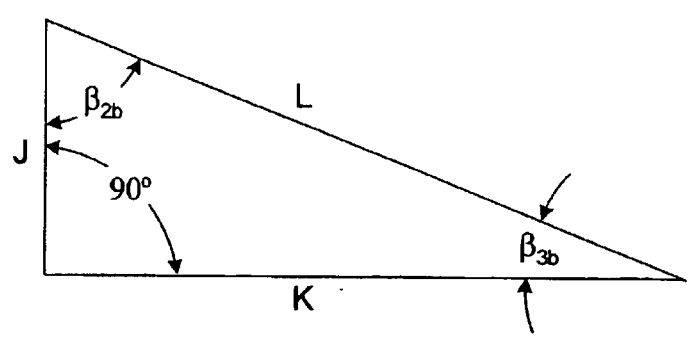
FIG. 7 is a geometric representation of the subject matter of FIG. 6.

Upon noting that the plane of the array 34 as at an angle of 90° relative to the plane of the array 36, it will be realized that $\beta_{3b} = 90° - \beta_{2b}$ (see FIGS. 6 and 7). Knowing the value of the ratio of the sines of the angles $\beta_{2b}$, $\beta_{3b}$, i.e., for example, the value of the ratio of the sines of the angles $\beta_{2b}$, $\beta_{3b}$=M, one can determine the value of $\beta_{2b}$ as will now be described.

$$\sin \beta_{2b} / \sin \beta_{3b} = M$$

$$\sin \beta_{2b} = K/L \text{ (opposite/hypotenuse)}$$

$$\sin \beta_{3b} = J/L \text{ (opposite/hypotenuse)}$$

$$\frac{K/L}{J/L} = \frac{K}{J} = M$$

As will be noted in FIG. 7, the ratio K/J is tangent $\beta_{2b}$. Thus, arrangement $M=\beta_{2b}$.

One is thus able to determine the unique, particular, single angle of direction of travel of neutrons 52 relative to the array 34, and thus relative to the device 30 itself. Based on this information, an indicator provided on the device 30 can visually indicate the direction (relative to the device 30) from which the neutrons 52 are traveling.

Once the direction of travel of the neutrons 52 is determined, the device 30 can be rotated so that a single array (for example array 34, FIG. 3) is positioned with its plane substantially perpendicular to the direction of neutron 42 travel, using the indicator described above. With such a single array 34 so positioned (in turn resulting in the all the other arrays 32, 36, 38, 40, 42 being positioned so that they are not exposed to neutron flow), a direct reading of the intensity of the neutron field 50 can be taken by this single array 34, with sin β for the array 34 being 1 (maximum intensity read by array 34).

In accordance with the above description, the direction of a source of neutrons can be readily determined, and the intensity of the neutrons field can be read in a proper manner, consistent from one reading to the next. Furthermore, it will be realized that one skilled in the art could use a tensor approach and direction cosines to determine the direction of neutron travel based on intensity information of three arrays exposed to neutrons, while holding the device 30 in place.

The foregoing description of the embodiment of the invention has been presented for purposes of illustration and description. It is not intended to be exhaustive or to limit the, invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. Apparatus for sensing neutron flow comprising:
    a first substantially planar array of flash memory cells; and
    a second substantially planar array of memory cell, the plane of the second substantially planar array of memory cells being at an angle relative to the plane of the first substantially planar array of memory cells.

2. The apparatus of claim 1 wherein at least one of the first and second substantially planar arrays is mounted on a neutron-absorbing substrate.

3. The apparatus of claim 1 wherein the first and second substantially planar arrays are mounted on neutro-absorbing substrates.

4. The apparatus of claim 1 wherein the angle between the plane of the first substantially planar array of memory cells and the plane of the second substantially planar array of memory cells is substantially 90°.

5. The apparatus of claim 1 and further comprising a third substantially planar array of memory cells, the plane of the third substantially planar array of memory cells being at an angle relative to the plane of the first substantially planar array of memory cells and being at an angle relative to the plane of the second substantially planar array of memory cells.

6. The apparatus of claim 5 wherein the angle between the plane of the first substantially planar array of memory cells and the plane of the second substantially planar array of memory cells is substantially 90°.

7. The apparatus of claim 5 wherein the angle between the plane of the first substantially planar array of memory cells and the plane of the second substantially planar array of memory cells is substantially 90°, and the angle between the plane of the second substantially planar array of memory cells and the plane of the third substantially planar array of memory cells is substantially 90°.

8. The apparatus of claim 7 wherein the angle between the plane of the first substantially planar array of memory cells and the plane of the third substantially planar array of memory cells is substantially 90°.

9. The apparatus of claim 8 wherein the memory cells are flash memory cells.

10. Apparatus for sensing neutron flow comprising:
    a first substantially planar array of flash memory cells;
    a second substantially planar array of flash memory cells having an edge adjacent an edge of the first substantially planar array of flash memory cells; and
    a third substantially planar array of flash memory cells having a first edge adjacent an edge adjacent an edge of the first substantially planar array of flash memory cells and a second edge adjacent an edge of the second substantially planar array of flash memory cells;
    the plane of the second substantially planar array of flash memory cells being at an angle relative to the plane of the first substantially planar array of flash memory cells;
    the plane of the third substantially planar array of flash memory cells being at an angle relative to the plane of the first substantially planar array of flash memory cells and being at an angle relative to the plane of the second substantially planar array of flash memory cells.

11. The apparatus of claim 10 wherein the first, second and third substantially planar arrays are mounted on neutron-absorbing substrates.

12. The apparatus of claim 11 wherein the angle between the plane of the first substantially planar array of flash memory cells and the plane of the second substantially planar array of flash memory cells is substantially 90°.

13. The apparatus of claim 11 wherein the angle between the plane of the first substantially planar array of flash memory cells and the plane of the second substantially planar array of flash memory cells is substantially 90°, and the angle between the plane of the second substantially planar array of flash memory cells and the plane of the third substantially planar array is substantially 90°.

14. The apparatus of claim 13 wherein the angle between the plane of the first substantially planar array of flash memory cells and the plane of the third substantially planar array of flash memory cells is substantially 90°.

15. The apparatus of claim 14 wherein each of the first, second and third planar arrays of flash memory cells is substantially rectangular in configuration.

\* \* \* \* \*